United States Patent
Zupcau

(10) Patent No.: US 8,861,158 B2
(45) Date of Patent: Oct. 14, 2014

(54) ESD TRIGGER FOR SYSTEM LEVEL ESD EVENTS

(75) Inventor: Dan Zupcau, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 262 days.

(21) Appl. No.: 13/089,464

(22) Filed: Apr. 19, 2011

(65) Prior Publication Data
US 2011/0261489 A1 Oct. 27, 2011

Related U.S. Application Data

(60) Provisional application No. 61/326,252, filed on Apr. 21, 2010.

(51) Int. Cl.
*H02H 3/20* (2006.01)
*H02H 9/04* (2006.01)
*H01L 27/02* (2006.01)
*H01L 23/62* (2006.01)

(52) U.S. Cl.
CPC .............. *H02H 9/046* (2013.01); *H01L 23/62* (2013.01); *H01L 27/0296* (2013.01); *H01L 27/0285* (2013.01)

USPC ........... 361/91.1; 361/56; 361/91.2; 361/91.3

(58) Field of Classification Search
CPC ...... H02H 9/04; H02H 3/202; H01L 27/0266; H01L 27/0259
USPC .................. 361/56, 91.1, 91.2, 91.3
See application file for complete search history.

(56) References Cited

U.S. PATENT DOCUMENTS

| | | | |
|---|---|---|---|
| 5,946,177 A * | 8/1999 | Miller et al. ..................... 361/56 |
| 5,969,929 A * | 10/1999 | Kleveland et al. ............ 361/111 |
| 6,249,413 B1 * | 6/2001 | Duvvury ........................ 361/111 |
| 6,657,458 B1 * | 12/2003 | Sharpe-Geisler ................ 326/41 |
| 6,690,555 B1 * | 2/2004 | Pasqualini ....................... 361/56 |
| 7,570,468 B2 * | 8/2009 | Bernard et al. .................. 361/56 |
| 7,593,201 B2 * | 9/2009 | Ishizuka et al. ................. 361/56 |
| 7,593,202 B2 * | 9/2009 | Khazhinsky et al. ........... 361/56 |
| 7,719,813 B2 * | 5/2010 | Chen ............................. 361/111 |
| 7,738,222 B2 * | 6/2010 | Deutschmann et al. ........ 361/56 |
| 2011/0110004 A1 * | 5/2011 | Maier .............................. 361/56 |

* cited by examiner

*Primary Examiner* — Zeev V Kitov

(57) ABSTRACT

A circuit includes first logic that generates a first signal suitable to activate at least one ESD clamp in response to an electrostatic discharge (ESD) event having a first severity or a second severity higher than the first severity, and second logic that generates a second signal suitable to activate the ESD clamp in response to the ESD event having the second severity, the second signal time multiplexed with the first signal.

20 Claims, 7 Drawing Sheets

ESD TRIGGER FOR SYSTEM LEVEL ESD EVENTS

PRIORITY CLAIM

This application claims priority under 35 U.S.C. 119 to U.S. provisional application No. 61/326,252, entitled "ESD TRIGGER FOR SYSTEM LEVEL ESD EVENTS", filed on Apr. 21, 2010, which is incorporated herein by reference in its entirety.

BACKGROUND

An electrostatic discharge (ESD) event injects a significant amount of charge through an input terminal of a circuit (often, an integrated circuit). Without some sort of protection, the high currents and voltages associated with the ESD event may damage the circuit. To protect the circuit, the ESD event may be detected and a signal may be created in response. The signal may be applied to a switch or other mechanism (i.e., an ESD clamp) to direct enough ESD charge to ground to prevent circuit damage.

Conventional ESD protection mechanisms do not necessarily protect against ESD events over a broad range of severities.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
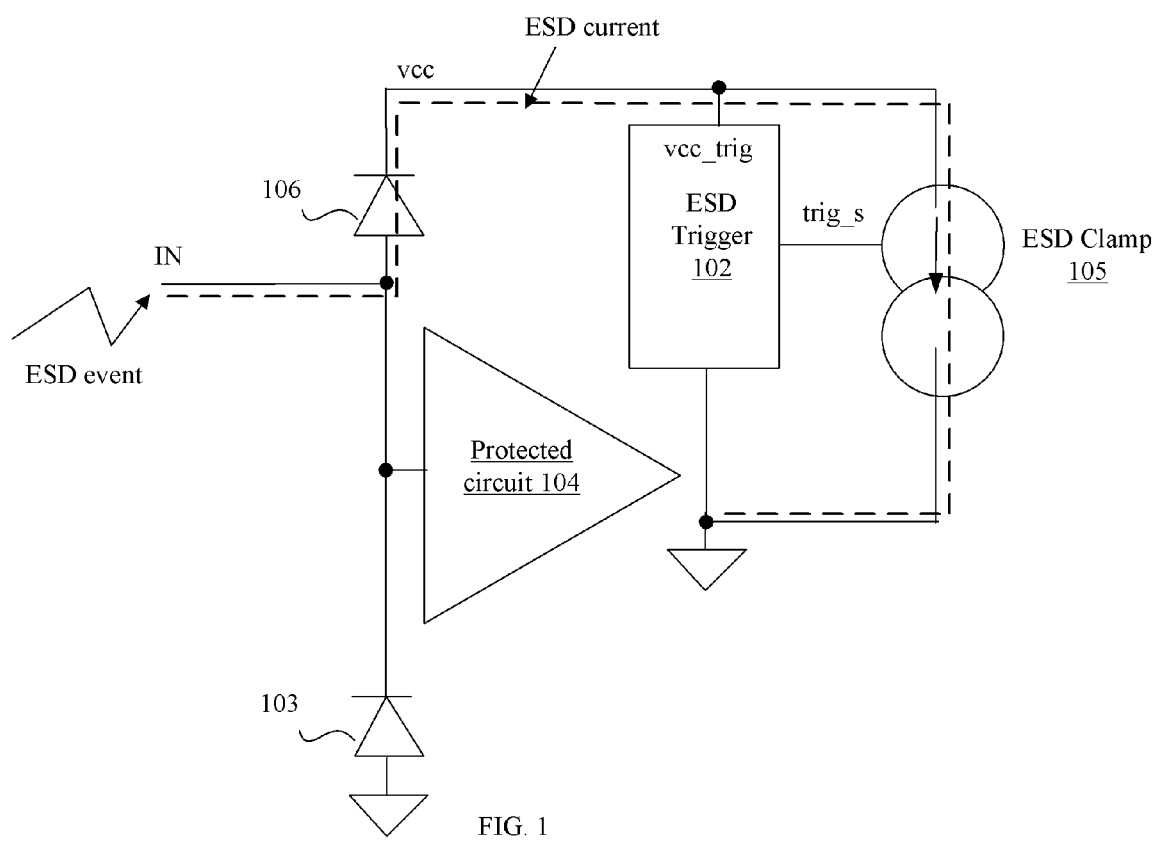
FIG. 1 illustrates an ESD event occurring at pin IN of an integrated circuit.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Overview

An ESD trigger circuit generates a first signal to activate an ESD clamp in response to an electrostatic discharge (ESD) event of a first severity (e.g., HBM ESD). The ESD trigger also responds to an ESD event of a second severity, higher than the first (e.g. system level ESD event), and in response generates a second signal to activate the ESD clamp. The second signal is generated by the ESD trigger in response to both an ESD event of the first severity and an ESD event of the second severity. If the ESD event is of the first severity, both the first and the second signals are generated and time multiplexed, with the effect that the ESD clamp is activated faster than the speed of the ESD event, and the performance of the ESD protection circuit is essentially the same as when only the first signal is generated.

If the ESD event is of the second severity, both the first and second signals are generated and time multiplexed, the ESD clamp is activated by the second signal with minimal delay after the ESD event, and the ESD clamp is kept active by the first signal even after the second signal is no longer asserted, with the effect that the respective ESD protection responds quickly enough and long enough to divert the ESD charge away from the protected circuitry.

Herein, "time multiplexed" means that two or more signals are multiplexed together into different time slots to form a composite signal. Although portions of the signals may superimpose (add) in the composite signal, each signal in the time multiplex is present without significant contribution from the other during some period of time.

Herein, "higher severity" and "lower severity", when made in reference to the severity of ESD events, indicates that the "higher severity" event comprises a faster rise time, shorter duration, and higher peak current than does the "lower severity" ESD event.

Description of Various Embodiments

An ESD event injects a significant amount of electrical charge to an ungrounded integrated circuit pin, referred to as the zapped pin, in a very short time, usually hundreds of nanoseconds (ns) or less. FIG. 1 illustrates an ESD event occurring at pin IN of an integrated circuit. Without adequate ESD protection circuitry, the high currents and voltages associated with the ESD event can damage the protected circuit 104 which is coupled to the zapped pin IN.

The ESD protection circuitry for the protected circuit 104 in FIG. 1 comprises: (1) ESD diodes 103 and 106, which are reverse biased during the normal functional mode of the respective integrated circuit, (2) a sensor 102 that detects the ESD event, referred to as ESD Trigger, and (3) a voltage controlled current switch 105, also referred to as an ESD clamp. When ESD charge is injected at the zapped pin IN during an ESD event, the ESD diode 106 becomes forward biased, allowing the respective ESD current to be diverted away from the protected circuit 104 to the power supply bus vcc. The ESD trigger 102 monitors the signal on the vcc bus and generates an output pulse trig_s of appropriate duration if it detects an ESD event. During an ESD event (and not at any other times during proper operation), the output trig_s of the ESD trigger activates an ESD clamp 105, which clamps the ESD current from the vcc bus to ground. Consequently, during the ESD event, the ESD current is diverted away from the protected circuit 104, through the forward biased ESD diode 106, through the power supply bus vcc, and through the activated ESD clamp 105 to ground.

One standard used to qualify the ESD performance of an integrated circuit is the HBM (human body model) standard JESD22-A114-B (JEDEC JESD-A114E "Electrostatic Discharge (ESD) Sensitivity Testing Human Body Model (HBM)", January 2007, Standard body: JEDEC, Revision:E, Date: 2007). An HBM generator includes a capacitor (e.g., 100 pF) which is charged to a specified HBM voltage. The charge stored in the capacitor is then discharged through a resistor (e.g., 1500 Ohm) to a device under test (DUT), and the voltage across the DUT is then recorded. Per the JESD22-A114-B standard, a 3.3 kV HBM ESD event has 2 ns to 10 ns ESD current rise time, a peak ESD current of 2.2 A, and an ESD event duration of more than 350 ns.

Another standard used to qualify the ESD performance for integrated circuits is described in the IEC 61000-4-2 International Specification (IEC 61000-4-2, International Electrotechnical Commission (IEC) 61000-4-2, Edition 2.0, B:2008 Electromagnetic Compatibility (EMC), Testing and Measurement Techniques—Electrostatic Discharge Immunity Test, December 2008, Standard Body: International Electrotechnical Commission (IEC), Revision: 2.0, Date: December 2008). This standard refers to ESD protection capability when a specified type of ESD event occurs at the encasing of the whole system (the PCB, printed circuit board, populated with integrated circuits or other devices). Such an event is referred to herein as a system level ESD event. Many integrated circuit vendors characterize system level ESD protection capability at the integrated circuit level for a condition more restrictive than that set forth in the IEC 61000-4-2 International Specification, in which the system level ESD event occurs at an actual pin of the integrated circuit under test.

A system level ESD generator may comprise a capacitor (e.g., 150 pF) that is initially charged at the respective IEC 61000-4-2 voltage (e.g., 2 kV to 8 kV for contact level ESD) and then discharged through a resistor (e.g., 300 Ohm) to the device under test. The IEC 61000-4-2 International Specification specifies that an 8 kV contact level system level ESD event current has a rise time between 0.75 ns and 1 ns, a peak value of 33 A and a duration of less than 100 ns.

The peak ESD current for an 8 kV contact level system level ESD event is significantly higher (e.g., 15×), the ESD current rise time is faster (e.g., 2.67×), and the ESD event duration is shorter (e.g., 3.5×) compared with a 3.3 kV HBM ESD event. The 8 kV system level ESD event is characterized by (1) a much higher rate of energy transfer per unit of time to the device under test than a 3.3 kV HBM ESD event, and (2) the peak ESD current is reached faster than in the case of the 3.3 kV HBM ESD event. A system level ESD event thus has a higher level of severity than an HBM ESD event.

Figure 2:
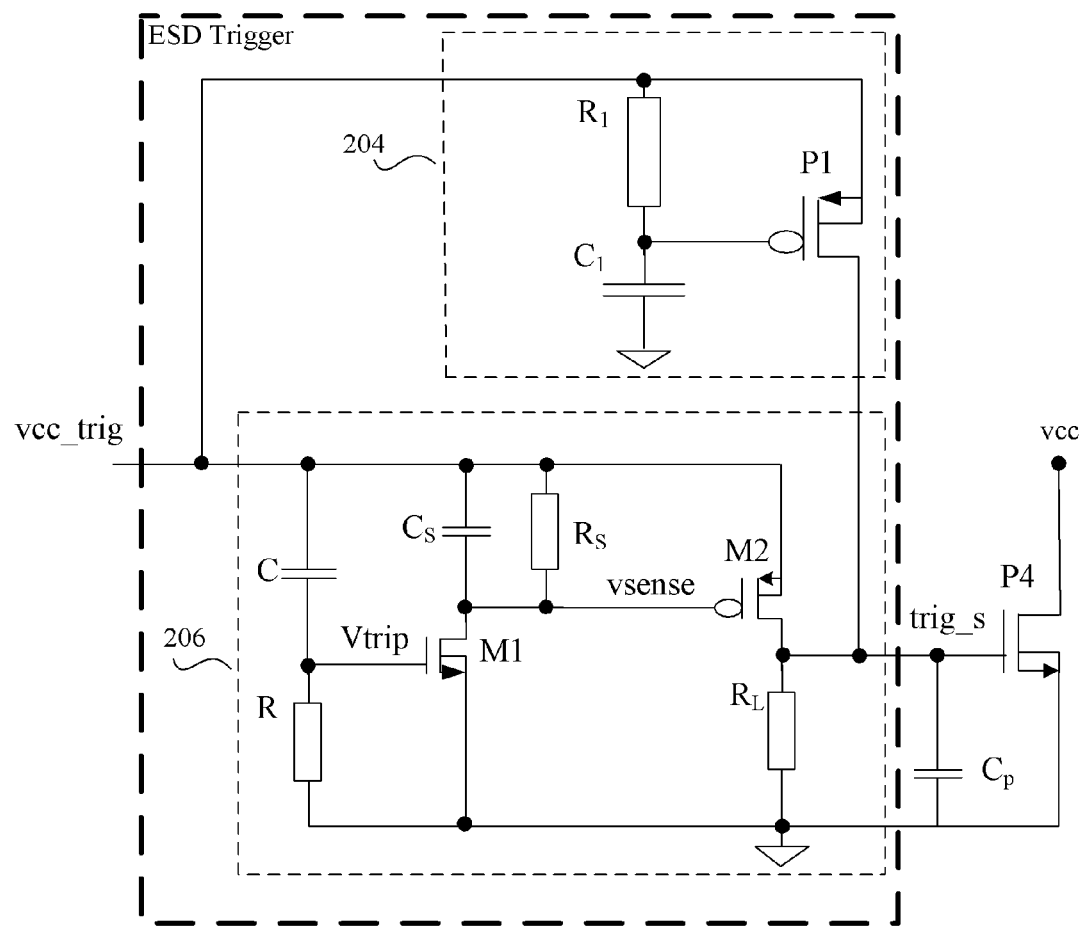
FIG. 2 illustrates an ESD protection circuit including a first embodiment of an ESD trigger employing feed-forward time division multiplexing to protect against a range of ESD events.

FIG. 2 illustrates a first embodiment of an ESD protection circuit including an ESD trigger employing feed-forward time division multiplexing to protect against a range of ESD events. The circuit includes first trigger logic 206 to activate an ESD clamp P4 in response to an ESD event of a first severity, for example a human body mode (HBM) ESD event.

The circuit further includes second trigger logic 204 to activate the ESD clamp P4, with much lower delay than the response of logic 206, in response to both an ESD event of a second severity higher than the first severity (for example a "system level" ESD event), and an ESD event of a first severity (for example an HBM ESD event). An input signal vcc_trig is fed forward to output trig_s via second trigger logic 204. First trigger logic 206 also responds to the ESD event by monitoring its vcc_trig input and its output is time multiplexed with the output of second trigger logic 204 in order to generate the trig_s output of the ESD Trigger. Consequently, the ESD trigger in FIG. 2 reacts to and may be used to protect against both an ESD event of first severity and against an ESD event of a second severity.

In more detail, the first trigger logic 206 comprises three stages. The first stage, called slew rate detector, is an RC derivator connected between the input vcc_trig and the ground of the trigger logic 206, comprising components R and C. Herein, R refers to a linear resistance element (i.e., linear within design tolerance of the implementation). The letter C refers to a capacitive element. The first stage generates a voltage at its Vtrip output in response to the vcc_trig input voltage slew rate $$V(Vtrip) = R*C*d(vcc\_trig)/dt$$

The RC time constant of the slew rate detector stage is adjusted such that, during an ESD event and only in that condition:

$$R*C*d(vcc\_trig)/dt > Vth(M1)$$

where Vth(M1) is the M1 nFET threshold voltage.

The first stage generates a voltage pulse at its Vtrip output responsive to a voltage slew rate at the input vcc_trig. Values of R and C may be selected to activate nFET M1 in response to detecting a vcc_trig slew rate indicative of an ESD event of the first severity, e.g. an HBM ESD event. The slew rate detector stage also generates a pulse during an ESD event of second severity, which is faster than an ESD event of first severity (vcc_trig input slew rate is larger during an ESD event of second severity); however, the delay through the trigger logic 206 is not commensurate with the higher speed of an ESD event of second severity.

If there is no ESD event, then $$R*C*d(vcc\_trig)/dt = <Vth(M1)$$

The second stage in the trigger logic 206 comprises components $C_S$, $R_S$, and nFET M1. This stage includes a voltage level detector implemented with nFET M1 and a pulse generator implemented with the parallel RC circuit $R_S$, $C_S$.

Following an ESD event, a short pulse of M1 drain current is injected into the $R_S$, $C_S$ circuit, generating a voltage pulse between nodes vcc_trig and vsense. The $R_S*C_S$ time constant dictates the pulse width of the voltage pulse V(vcc_trig, vsense) thus generated.

If there is no ESD event, nFET M1 does not become active due to the fact that the slew rate detector output Vtrip is smaller than its threshold voltage, thus no M1 drain current is generated and V(vcc_trig, vsense)=0, with the consequence that the ESD Trigger is not activated.

The third stage in the trigger logic 206, called output driver, comprises pFET M2 and resistor $R_L$. When the voltage between the gate and the source of pFET M2 is larger than the threshold voltage of transistor M2

$$V(vcc\_trig, vsense) > Vth(M2)$$

The pFET M2 in trigger logic 206 generates a pulse of drain current that generates a voltage pulse across the $R_L$ load resistor. The current output from the pFET M2 in the trigger logic 206 is summed through resistor $R_L$ and added with the current output from the pFET P1 in the trigger logic 204 in order to generate a voltage pulse at the output trig_s of the ESD trigger. The voltage pulse output corresponding only to the contribution of trigger logic 206 has a delay relative to the vcc_trig input and a pulse width (defined as the time difference between the rise and the fall of the pulse signal through a level corresponding to the activation threshold of the ESD clamp P4) determined by $C_S$, $R_S$.

Referring again to FIG. 1, the ESD charge injected at the zapped pad is thus clamped through the forward biased diode 106, through the power supply bus vcc and through the ESD clamp 105 to ground fast enough and with sufficient duration to safely discharge the ESD charge injected during an ESD event of the first severity. During an ESD event of second severity, the trigger logic 206 maintains the ESD clamp active long enough that substantially all the injected ESD charge is dissipated to ground.

If however the ESD event is of a second severity higher than the first (e.g., a system level ESD event), the first trigger logic 206 may not be suitably adapted to handle the ESD event without incurring damage to the protected circuit (refer to FIG. 1, element 104), due to having a substantially larger input-to-output delay than the one required to react to that ESD event type. The second trigger logic 204 comprises resistor $R_1$, capacitor $C_1$ and pFET P1. Values of these components are selected to cause activation of the pFET P1 during a second severity ESD event, for the condition $$R_1*C_1*d(vcc\_trig)/dt > Vth(P1)$$

where Vth(P1) is the pFET P1 threshold voltage. The circuit elements in the trigger logic 204 are selected for lower vcc_trig to trig_s delay commensurate with an ESD event of second severity. The pFET P1 output current in trigger logic 204 is summed on resistor $R_L$, with the output current of the pFET M2 in the trigger logic 206 in a time division multiplexed manner, resulting in the composite trig_s signal that controls the respective ESD clamp P4. The ESD charge from a second severity ESD event is thus clamped to ground fast enough to avoid damage to the protected circuit, while ensuring that substantially all the charge associated with the second severity ESD event is dissipated to ground, away from the protected circuit.

In some implementations, the parasitic gate to source capacitance Cp of ESD clamp P4 is advantageously employed to at least partially determine a duration at which the composite ESD trigger signal output trig_s is maintained above the activation threshold value of the ESD clamp P4. The parasitic capacitance Cp (or multiple such capacitances in the parallel ESD clamps) substitutes for a discrete (i.e. non-parasitic) capacitive element that would otherwise be employed to determine the respective duration of the trig_s signal.

The trigger logic 204 also activates for ESD events of the first severity type, even though such events can be safely handled by trigger logic 206 without time division multiplexing the output currents of the stages 204 and 206. To protect against ESD events of the second severity type, the logic 204 may be adapted to activate with delay and duration commensurate with the speed and duration of the second severity event. Logic 206 may be adapted to activate after a longer delay and for a longer duration. For example, for system level ESD events, the logic 204 may activate in under a nanosecond, for example between 0.1 ns and 0.3 ns (more particularly, around 0.2 ns), and remain active for example around 100 ns, while the logic 206 may not activate until between 1 ns and 3 ns (more particularly, around 2 ns) and remain active for example more than 1000 ns. Diodes and ESD clamp devices should be rated for the higher severity ESD current (e.g., 33 A).

Figure 3:
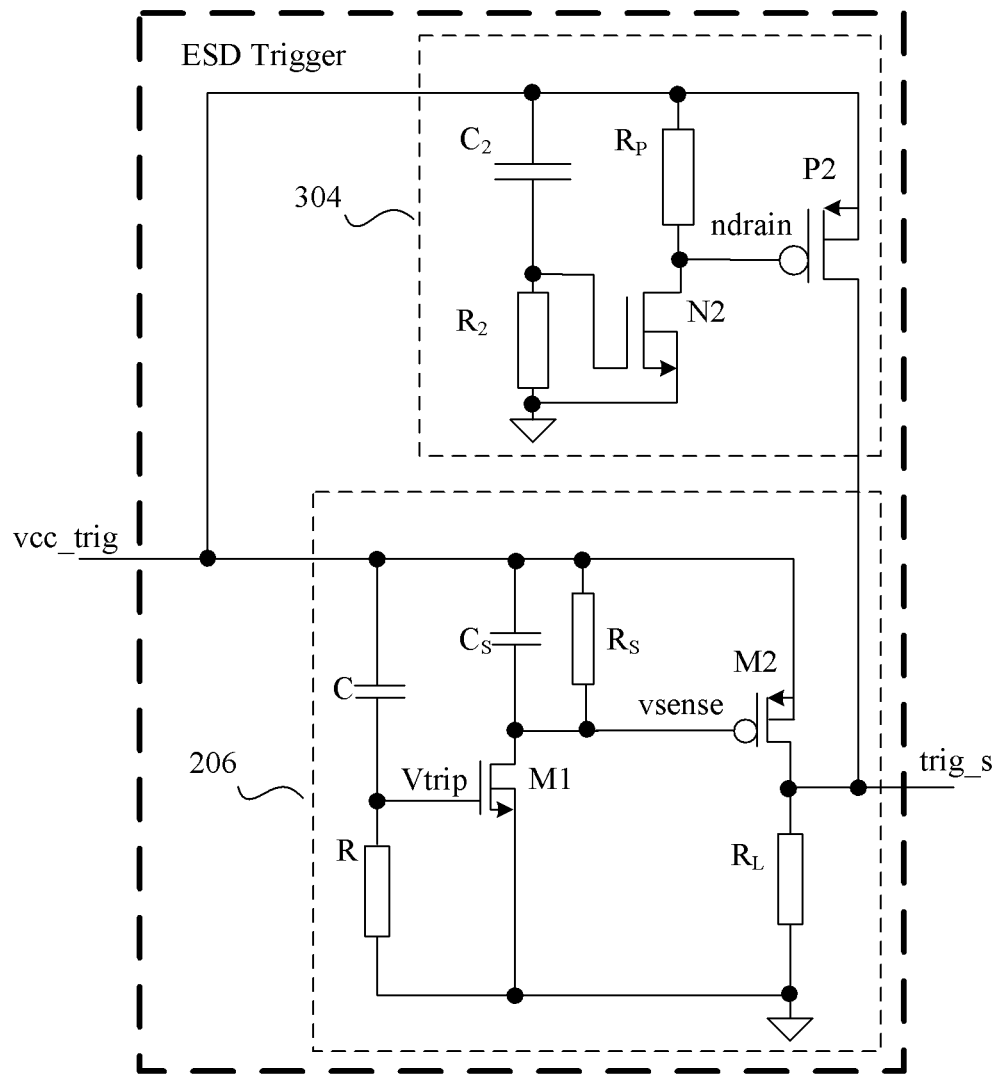
FIG. 3 illustrates a second embodiment of an improved ESD trigger circuit employing feed-forward time division multiplexing to protect against a range of ESD events.

FIG. 3 illustrates a second embodiment of an improved ESD trigger employing feed-forward time division multiplexing to protect against a range of ESD events. By way of example the first trigger logic 206 is substantially similar to that described in conjunction with FIG. 2. The second trigger logic 304 comprises components $C_2$, $R_2$, $R_P$, nFET N2 and pFET P2. The $C_2$, $R_2$ values are selected such that $$R_2*C_2*d(vcc\_trig)/dt > Vth(N2)$$

in the case of a system level ESD event, where Vth(N2) is the nFET N2 threshold voltage. If the voltage between vcc_trig and N2 drain is larger than the pFET P2 threshold voltage $$V(vcc\_trig, N2drain) > Vth(P2)$$

a significant current is generated in the drain of pFET P2 immediately after the ESD event, and the trig_s output of the ESD trigger is pulled to vcc_trig level, activating the ESD clamp(s). The pFET P2 is configured as a common source amplifier. This particular ESD trigger embodiment has the advantage that it does not allow the pFET P2 gate-to-source capacitance, which can be significant, to appear in parallel with capacitance $C_2$ that is used to detect the system level ESD event. The sensitivity of the trigger logic 304 to ESD events is determined only by elements $C_2$, $R_2$ and nFET N2, which is a small device and thus its gate to source capacitance is relatively small. Consequently, this embodiment may provide a more linear and thus more predictable response to input vcc_trig voltage slew rates than the trigger logic 204 of FIG. 2.

Figure 4:
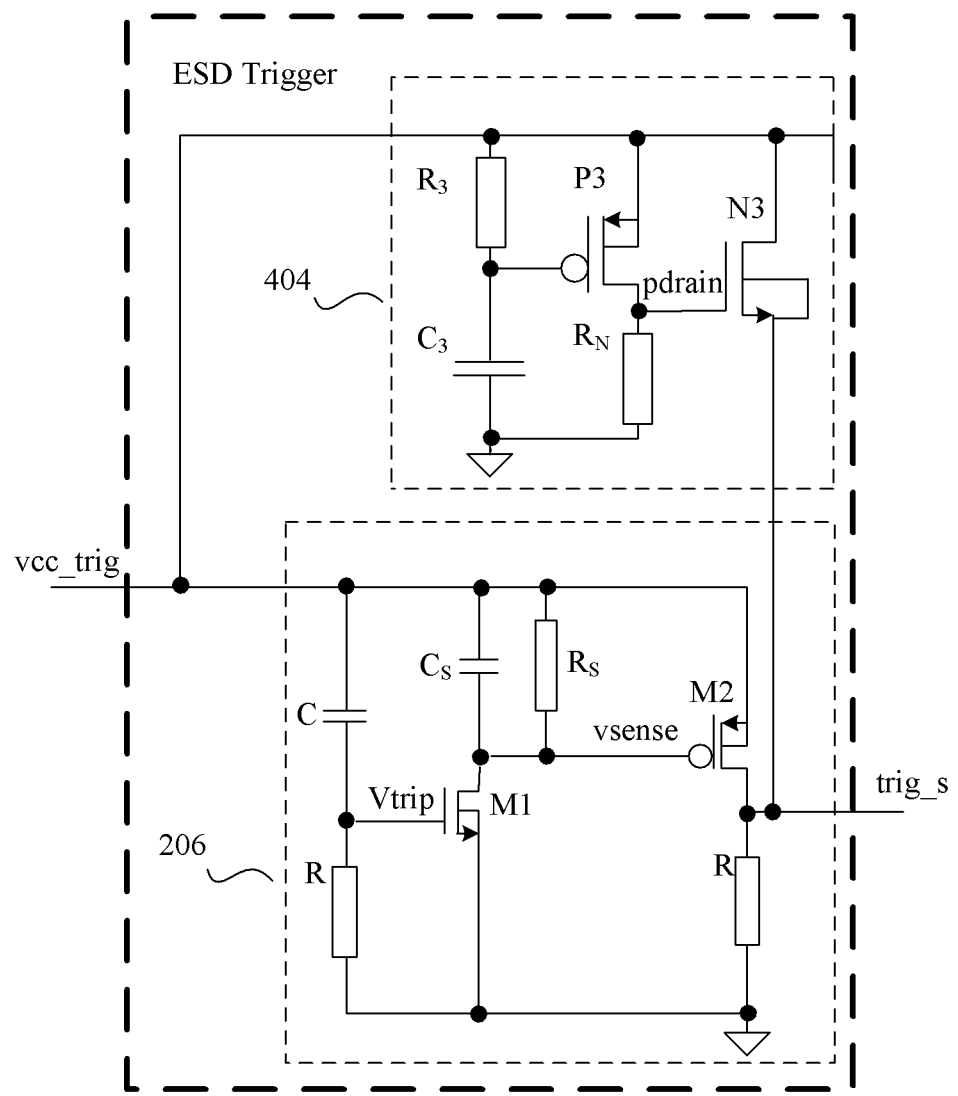
FIG. 4 illustrates a third embodiment of an improved ESD trigger circuit employing feed-forward time division multiplexing to protect against a range of ESD events.

FIG. 4 illustrates a third embodiment of an ESD trigger circuit employing feed-forward time division multiplexing to protect against a range of ESD events. By way of example, the first trigger logic 206 is substantially similar to that described in conjunction with FIG. 2. The second trigger logic 404 comprises components $C_3$, $R_3$, $R_N$, nFET N3 and pFET P3. The $C_3$, $R_3$ values are selected such that $$R_3*C_3*d(vcc\_trig)/dt > Vth(P3)$$

for a system level ESD event, where Vth(P3) is the pFET P3 threshold voltage. During a system level ESD event, the voltage at P3 drain follows vcc_trig and the source of the nFET source follower N3 pulls the ESD Trigger output trig_s up to $$V(vcc\_trig) - Vgs(N3)$$

where Vgs(N3) is the nFET N3 gate to source voltage. NFET N3 should be selected to have a large aspect ratio W/L (W is the width, for example 1300 µm, L is the gate length, for example 0.5 µm) in order to be able to source the large amount of current needed to drive the large ESD clamp during the respective ESD event, with the implication that the node trig_s is pulled close to V(vcc_trig)−Vth(N3), where Vth(N3) is the N3 nFET threshold voltage. Circuit elements $C_3$, $R_3$, $R_N$, pFET P3 and nFET N3 the delay between vcc_trig and trig_s during a system level ESD event. Compared with the ESD trigger embodiments in FIG. 2 and FIG. 3, the ESD trigger in FIG. 4 has an improved fanout (e.g., the maximum size of an ESD clamp that can be driven by the ESD trigger without degradation of the ESD protection capability). This improved fanout results from the output stage in trigger logic 404 including the nFET N3 source follower (voltage source output configuration, less sensitive to capacitive loading compared with the other two ESD Trigger embodiments, which employ a current source output configuration). This particular embodiment has the advantage that is does not allow the large nFET N3 gate-to-source capacitance to appear in parallel with capacitance $C_3$ used to detect the system level ESD event. The ESD event sensitivity of the trigger logic 404 is controlled only through elements $R_3$, $C_3$ and pFET P3, which is a relatively small device and thus has a reduced gate to source capacitance compared with $C_3$. Consequently, this ESD trigger may be faster in some implementations than the ESD trigger embodiment of FIG. 3; it may also provide a linear and thus more predictable response to input vcc_trig voltage slew rates than the trigger logic 204 of FIG. 2.

Figure 5:
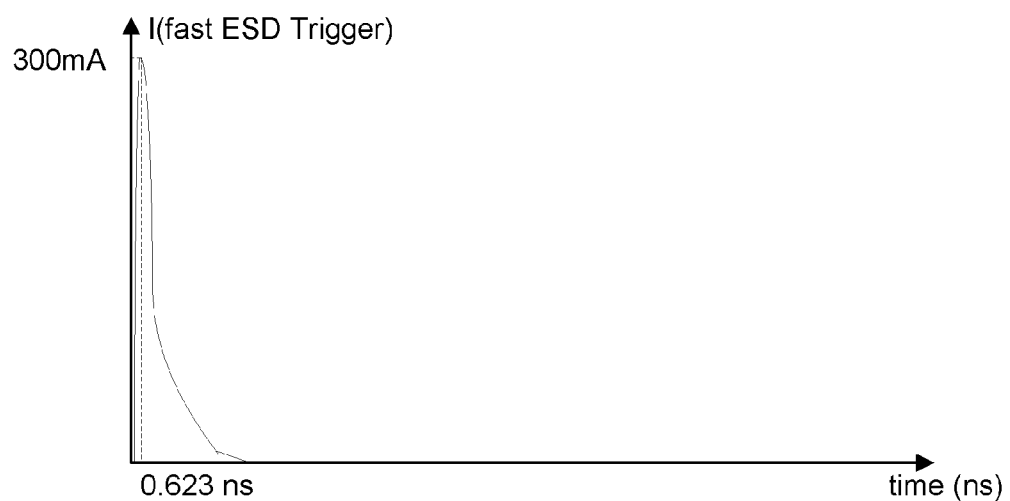
FIG. 5 illustrates an exemplary current output of trigger logic 204 in a response to higher severity ESD event.

FIG. 5 illustrates an exemplary current output from the trigger logic 204, 304 or 404 (i.e., "fast trigger") during a high severity ESD event. The trigger logic 204 responds to a high severity ESD event and feeds a pulse of current (large peak value, small delay, small duration) forward to the output trig_s, generating a voltage pulse on the load resistor $R_L$, thus activating an ESD clamp, with the result being a rapid decrease with time of the ESD voltage/current at the zapped pad. The time and current values presented in FIG. 5 are shown for illustrative purposes and will vary with the particular implementation.

Figure 6:
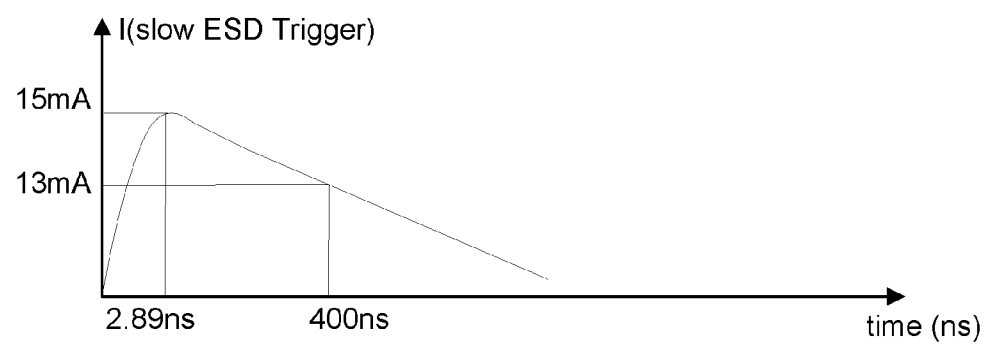
FIG. 6 illustrates and exemplary current output of ESD trigger logic 206 in response to a higher severity ESD event.

FIG. 6 illustrates an exemplary current output from the trigger logic 206 (also called "slow ESD trigger") during a high severity level ESD event. The trigger logic 206 responds to a high severity ESD event by generating a pulse of current which is characterized by smaller peak value, larger delay and larger duration compared with the current pulse generated by the fast ESD trigger 204 as illustrated for example in FIG. 5. The output current from the trigger logic 206 is fed forward to the output trig_s, generating a voltage pulse on resistor $R_L$ when summed with the pulse of current generated by the fast ESD trigger. Due to the long duration of the current pulse from the stage 206, the output trig_s has sufficient duration to draw harmful quantities of the injected ESD charge to ground. The time and current values presented in FIG. 6 are shown for illustrative purposes and will vary with the particular implementation.

Figure 7:
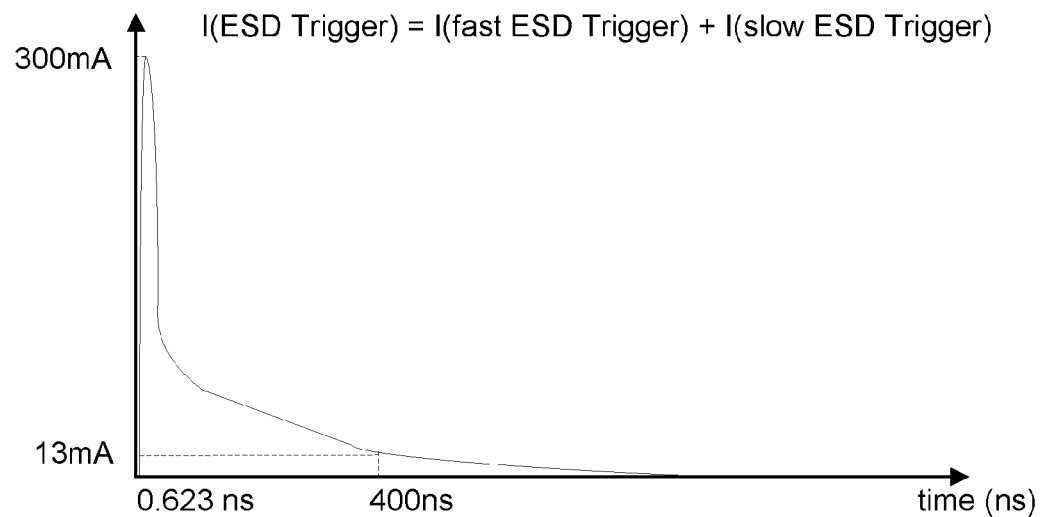
FIG. 7 illustrates an exemplary composite current output of logic 204 and 206 in response to a higher severity ESD event.

FIG. 7 illustrates an exemplary time multiplexed current output of fast and slow stages of an ESD trigger (such as the one shown in FIG. 2) during a high severity ESD event, such as a system level ESD event. The composite output current, which is the sum of the output current from the slow trigger logic 206 and the output current from the fast trigger logic 204, 304, or 404, rises higher and more quickly than it would if only the trigger logic 206 were activated, but it also falls off more slowly after a certain predetermined time (e.g. 6 ns after ESD event) than if only the fast trigger logic 204 were used. The current shown in FIG. 7 produces a voltage output pulse across the load resistor $R_L$. This composite, time division multiplexed behavior of the ESD Trigger output current, which generates a voltage across resistor $R_L$, provides protection against both high severity and low severity ESD events. The time and current values presented in FIG. 7 are shown for illustrative purposes and will vary with the particular implementation.

Figure 8:
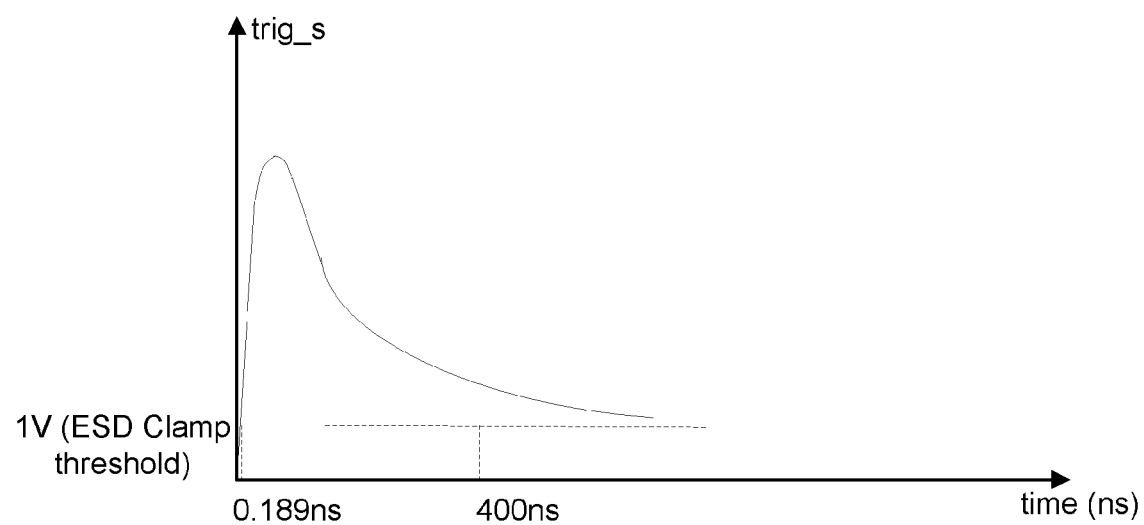
FIG. 8 illustrates an exemplary composite voltage output of logic 204 and 206 in response to a higher severity ESD event.

FIG. 8 illustrates an exemplary multiplexed voltage output of the fast and slow stages of the ESD trigger during a high severity ESD event, such as a system level ESD event. The composite output voltage rises more quickly than it would if the slow trigger logic 206 were used in isolation, but it also falls off more slowly than if the fast trigger logic 204, 304, or 404 were employed in isolation. The ESD clamps are activated with minimum delay and remain activated until the ESD trigger output voltage falls below their activation threshold level (e.g., 1V). The ESD trigger voltage output pulse, generated across the load resistor $R_L$, has sufficiently low delay to begin discharging the ESD charge injected at the zapped pad before circuit damage occurs, and sufficient duration to allow the ESD clamps to dissipate to ground enough ESD charge from the zapped pad to prevent circuit damage, for both the high severity and the low severity ESD events. The time and voltage values presented in FIG. 8 are shown for illustrative purposes and will vary with the particular implementation.

Figure 9:
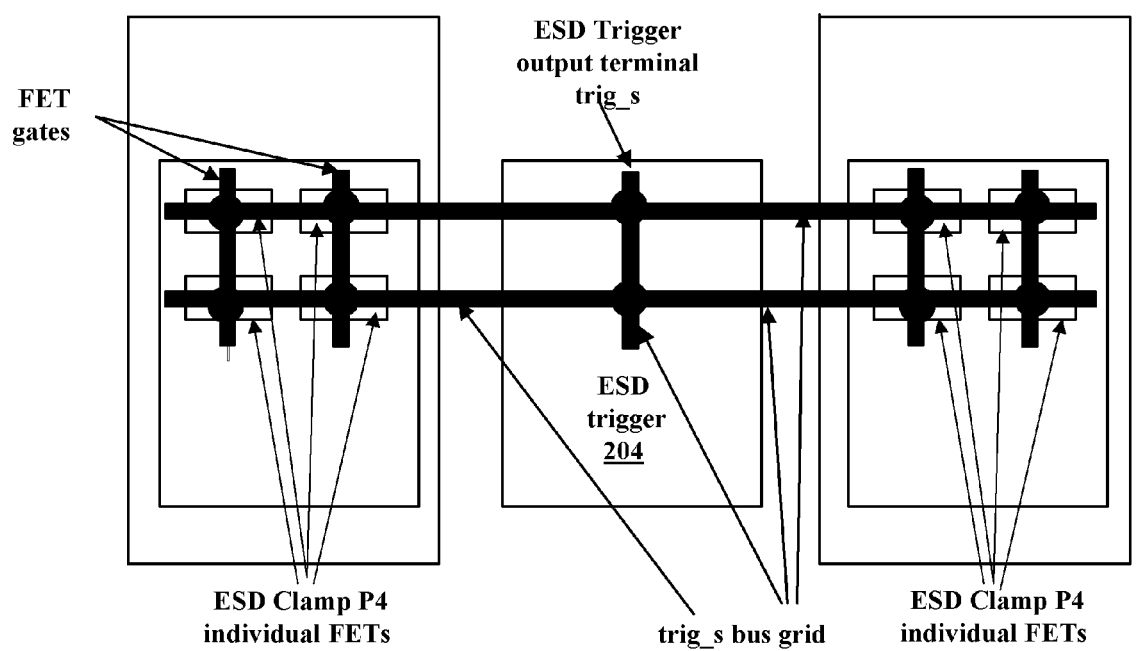
FIG. 9 illustrates an exemplary layout of the distribution of the output signal of ESD trigger logic to the inputs of ESD clamp devices.

FIG. 9 illustrates an exemplary layout implementation (e.g., CMOS) for distributing the ESD trigger output signal trig_s to the ESD clamps it controls. For CMOS implementations, the ESD clamps comprise FET devices. The layout is designed to effect a lowest available signal propagation delay from the output terminal trig_s of the ESD trigger logic to the most distant FET device. Excessive delay may result in circuit damage due to delay in activating the ESD clamps after a high severity ESD event. The ESD trigger output trig_s is distributed in a low resistance grid across the ESD clamp arrays in order to minimize the resistance in series with the gates of the FET devices that form the ESD clamps. This reduces the RC delay, where C is the sum of the gate to source capacitance of the nFET and of the associated bus parasitic capacitance and R is the bus parasitic resistance from the output pin of the ESD trigger up to the gate of the FET device. The layout distribution of the trig_s signal shown in FIG. 9 facilities limiting the propagation delay from the ESD trigger output to the most distant ESD Clamp FET to a predetermined value, for example less than 0.2 ns. A desired location of the ESD trigger is at or near the middle of the ESD protection network, with a substantially equal (e.g., within a propagation delay variation of 2-10%) distribution of ESD clamps around the ESD trigger location. In other words, the ESD trigger output terminal should be substantially centrally located with respect to surrounding ESD clamps.

Implementations and Alternatives

The techniques and procedures described herein may be implemented via logic distributed in one or more devices. The particular distribution and choice of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A circuit, comprising:
    an ESD diode coupled to a protected circuit, the ESD diode to divert current away from the protected circuit to a first logic and a second logic in an electrostatic discharge (ESD) event;
    the first logic to generate a first trigger signal suitable to activate an ESD clamp in response to an ESD event having a first severity or a second severity higher than the first severity; and
    the second logic to generate a second trigger signal suitable to activate the ESD clamp in response to the ESD event having the second severity, the second trigger signal fed-forward and placed concurrently with the first trigger signal on the input of the ESD clamp.

2. The circuit of claim 1, further comprising:
    the second logic comprising an RC derivator configured to set the output current for a PFET.

3. The circuit of claim 1, further comprising:
    the second logic adapted to generate the second trigger signal in response to an input signal slew rate that is 5-15 times faster than an input slew rate that will cause the first logic to generate the first trigger signal.

4. The circuit of claim 1, further comprising:
    the second logic comprising an RC derivator coupled with a common source amplifier.

5. The circuit of claim 4, further comprising:
    the common source amplifier configured to set the output current of a pFET.

6. The circuit of claim 1, further comprising:
    the second logic comprising an RC derivator coupled with a common source amplifier, which is coupled with an nPET configured as a source follower.

7. The circuit of claim 1, further comprising:
the second logic adapted to utilize a parasitic capacitance of one or more ESD clamps in substitution of a discrete capacitive element to set a duration of activation of the ESD clamp by the second trigger signal.

8. The circuit of claim 1, further comprising:
the second logic adapted to cause the second trigger signal to be suitable to activate the ESD clamp between 0.1 ns and 0.3 ns of the occurrence of the ESD event when the ESD event is of the second severity; and
the first logic adapted to cause the first trigger signal to be suitable to activate the ESD clamp between 1 and 3 ns of the occurrence of the ESD event when the ESD event is of the second severity.

9. The circuit of claim 1, further comprising:
a grid structure to propagate the first and second trigger signals to activation inputs of multiple ESD clamps;
the first and second logic centrally located among the ESD clamps.

10. The circuit of claim 1, wherein:
the second trigger signal comprising charge from the ESD event fed forward through the second logic; and
the first severity is the severity of a human body model ESD event, and the second severity is the severity of a system level ESD event.

11. A circuit comprising:
an electrostatic discharge (ESD) diode comprising an input terminal, the ESD diode capable of diverting ESD current away from a protected circuit;
first logic, the first logic coupled to the ESD diode, and adapted to generate a first trigger signal suitable to activate an ESD clamp in response to an ESD event at the input terminal of a first severity or a second severity higher than the first severity;
second logic, the second logic coupled to the ESD diode, and adapted to generate a second trigger signal suitable to activate the ESD clamp in response to the ESD event at the input terminal, the second trigger signal fed-forward and placed concurrently with the first trigger signal on the input of the ESD clamp,
wherein the ESD diode, in response to an ESD event, places the ESD current on the first logic and the second logic.

12. The circuit of claim 11, further comprising:
the second logic adapted to generate the second trigger signal in response to an input signal slew rate that is 5-15 times faster than an input slew rate that will cause the first logic to generate the first trigger signal.

13. The circuit of claim 11, further comprising:
a grid structure to propagate the first and second trigger signals to activation inputs of multiple ESD clamps;
the first and second logic centrally located among the ESD clamps.

14. The circuit of claim 11, wherein:
the second trigger signal comprising charge from the ESD event fed forward through the second logic; and
the first severity is the severity of a human body model ESD event, and the second severity is the severity of a system level ESD event.

15. The circuit of claim 11, further comprising:
the second logic adapted to cause the second trigger signal to be suitable to activate the ESD clamp between 0.1 ns and 0.3 ns of the occurrence of the ESD event when the ESD event is of the second severity; and
the first logic adapted to cause the first trigger signal to be suitable to activate the ESD clamp between 1 and 3 ns of the occurrence of the ESD event when the ESD event is of the second severity.

16. A method comprising:
detecting an electrostatic discharge (ESD) event comprising an ESD charge;
diverting the ESD charge away from a protected circuit directly to a first trigger circuit and a second trigger circuit;
generating a first trigger signal by the first trigger circuit suitable to activate an ESD clamp in response to an ESD event at the input terminal of a circuit, the ESD event having first severity or a second severity higher than the first severity; and
generating a second trigger signal by the second trigger circuit suitable to activate the ESD clamp in response to the ESD event at the input terminal, the second trigger signal is placed concurrently with the first trigger signal on the input of the ESD clamp.

17. The method of claim 16, further comprising:
generating the second trigger signal in response to an input signal slew rate that is 5-15 times faster than an input slew rate that will cause generation of the first trigger signal.

18. The method of claim 16, further comprising:
propagating the first and second trigger signals along a grid structure to inputs of multiple ESD clamps, from a location central among the ESD clamps.

19. The method of claim 16, further comprising:
feeding charge from the ESD event forward through a trigger circuit to the ESD clamp, wherein the first severity is the severity of a human body model ESD event, and the second severity is the severity of a system level ESD event.

20. The method of claim 16, further comprising:
the second trigger signal activating the ESD clamp between 0.1 ns and 0.3 ns of the occurrence of the ESD event when the ESD event is of the second severity; and
the first trigger signal activating the ESD clamp between 1 and 3 ns of the occurrence of the ESD event when the ESD event is of the second severity.

* * * * *